United States Patent
Lee et al.

(10) Patent No.: US 7,709,369 B2
(45) Date of Patent: May 4, 2010

(54) METHOD FOR FORMING A ROUGHENED CONTACT IN A SEMICONDUCTOR DEVICE

(75) Inventors: Jung-Seock Lee, Ichon-shi (KR); Ky-Hyun Han, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 241 days.

(21) Appl. No.: 11/679,178

(22) Filed: Feb. 26, 2007

(65) Prior Publication Data

US 2008/0108216 A1    May 8, 2008

(30) Foreign Application Priority Data

Nov. 3, 2006    (KR) .................... 10-2006-0108385

(51) Int. Cl.
*H01L 21/4763* (2006.01)
(52) U.S. Cl. ................ 438/620; 438/597; 438/618; 438/630
(58) Field of Classification Search ................ 438/197, 438/149, 166, 182, 99, 780, 714, 710, 689, 438/620
See application file for complete search history.

(56) References Cited

U.S. PATENT DOCUMENTS

| 6,399,493 | B1 * | 6/2002 | Dawson et al. | 438/682 |
| 2003/0087512 | A1 * | 5/2003 | Cheong | 438/595 |
| 2004/0046251 | A1 * | 3/2004 | Lee | 257/734 |
| 2005/0032250 | A1 * | 2/2005 | Mui et al. | 438/14 |
| 2006/0115948 | A1 * | 6/2006 | Tokunaga | 438/299 |

FOREIGN PATENT DOCUMENTS

| KR | 1020010018260 A | 3/2001 |
| KR | 1020040095876 A | 11/2004 |
| KR | 1020060008028 A | 1/2006 |
| KR | 1020060070157 A | 6/2006 |

* cited by examiner

*Primary Examiner*—Thanh V Pham
*Assistant Examiner*—Errol Fernandes
(74) *Attorney, Agent, or Firm*—Townsend and Townsend and Crew LLP

(57) ABSTRACT

A method for forming a contact in a semiconductor device includes opening a contact hole exposing a surface of a substrate, performing a first post treatment to form a rough portion at a bottom surface of the contact hole, and performing a second post treatment. The first post treatment includes using a fluorocarbon gas and the second post treatment includes using a nitrogen trifluoride ($NF_3$) gas.

7 Claims, 8 Drawing Sheets

RMS 2-3Å

METHOD FOR FORMING A ROUGHENED CONTACT IN A SEMICONDUCTOR DEVICE

CROSS-REFERENCE TO RELATED APPLICATIONS

The present invention claims priority of Korean patent application number 10-2006-0108385, filed on Nov. 3, 2006, which is incorporated by reference in its entirety.

BACKGROUND OF THE INVENTION

The present invention relates to a method for fabricating a semiconductor device, and more particularly, to a method for forming a contact in a semiconductor device with increased contact area and reduced leakage current.

As patterns in highly integrated memory devices below 0.100 μm become micronized, contact hole spacing has decreased. Accordingly, a high aspect ratio has caused margins to rapidly decrease, and thus, spacing distance between lines also have decreased. The source/drain contact resistance (Rc) increases substantially when the hole spacing and the spacing distance between lines decreases.

FIGS. 1A and 1B illustrate cross-sectional views showing a typical method for forming a contact in a semiconductor device.

Referring to FIG. 1A, a plurality of gate patterns are formed over a substrate 11. Each gate pattern includes a gate insulation layer 12, a gate electrode 13, and a gate hard mask layer 14. Cell spacers 15 are formed over the gate patterns. In more detail, a cell spacer layer is formed over the substrate 11 and the gate patterns. The cell spacer layer may include a nitride-based layer. An insulation layer is formed over the cell spacer layer to sufficiently gap-fill between the gate patterns. An etching process for forming a landing plug contact is performed. That is, the insulation layer is etched until the etching stops at the cell spacer layer to form trenches. This creates patterned insulation layers 16.

A buffer oxide layer is formed over the resultant substrate structure. The buffer oxide layer is formed with poor step coverage. That is, the buffer oxide layer is formed to have a small thickness over upper surfaces of the substrate 11 and sidewalls of the gate patterns and have a large thickness over an upper portion of the gate patterns, having an overhang structure. An etch-back process is performed on the buffer oxide layer to form contact holes 17 exposing the upper surfaces of the substrate 11 between the gate patterns. This creates patterned buffer oxide layers 18. During the etch-back process, portions of the cell spacer layer over the upper surfaces of the substrate 11 are also etched away. This creates the cell spacers 15. Since the etch-back process of the buffer oxide layer includes a dry etching process using plasma, the substrate damage 19 is often generated by plasma ions during the etch-back process.

Referring to FIG. 1B, a post treatment is performed to remove the substrate damage 19. The post treatment includes performing an etching process referred to as a light etch treatment (LET). Such post treatment often generates a substrate depression 20.

The typical method increases the depth of the substrate depression 20 by the LET process which reduces contact resistance of the source/drain contacts, by increasing the contact area. However, the increased depth may cause leakage current, and refresh may be deteriorated. Also, although a certain depth in the substrate depression 20 is generally needed to control the cell threshold voltage (Vth) and the refresh, this is typically not enough to increase the contact resistance value. Thus, a method for forming a contact that can maintain a certain depth of the substrate depression and improve contact resistance may be necessary.

SUMMARY OF THE INVENTION

Embodiments of the present invention are directed towards providing a method for forming a contact in a semiconductor device that can reduce leakage current and improve contact resistance.

In accordance with an aspect of the present invention, there is provided a method for forming a contact in a semiconductor device, including: opening a contact hole exposing a surface of a substrate; performing a first post treatment to form a rough portion at a bottom surface of the contact hole; and performing a second post treatment.

In accordance with another aspect of the present invention, there is provided a method for forming a contact in a semiconductor device, including: forming a gate pattern over a substrate; forming a barrier layer over the gate pattern; forming an insulation layer over the barrier layer; etching the insulation layer to form a contact hole; forming a buffer layer overhanging from an upper portion of the gate pattern exposed by the contact hole; etching the buffer layer and the barrier layer to expose a surface of the substrate; performing a first post treatment to form a rough portion on the exposed surface of the substrate; and performing a second post treatment to remove contamination generated in the first post treatment.

DESCRIPTION OF SPECIFIC EMBODIMENTS

The present invention relates to a method for forming a contact in a semiconductor device. According to embodiments of the present invention, a landing plug contact etching process is performed, a nitride-based layer used as a cell spacer is removed, and a light etch treatment (LET) is performed using a dry etch apparatus to remove substrate damages. A recipe of the LET process is controlled to improve the contact resistance value through increasing the surface area.

The source/drain contact resistance may be improved by creating a rough surface on the substrate depression while maintaining the depth for controlling the cell threshold voltage and refresh. Thus, an electrical characteristic of the device may be improved, and yield and reliability may be increased.

FIGS. 2A to 2E illustrate cross-sectional views showing a method for forming a contact in a semiconductor device in accordance with an embodiment of the present invention.

Figure 1A:
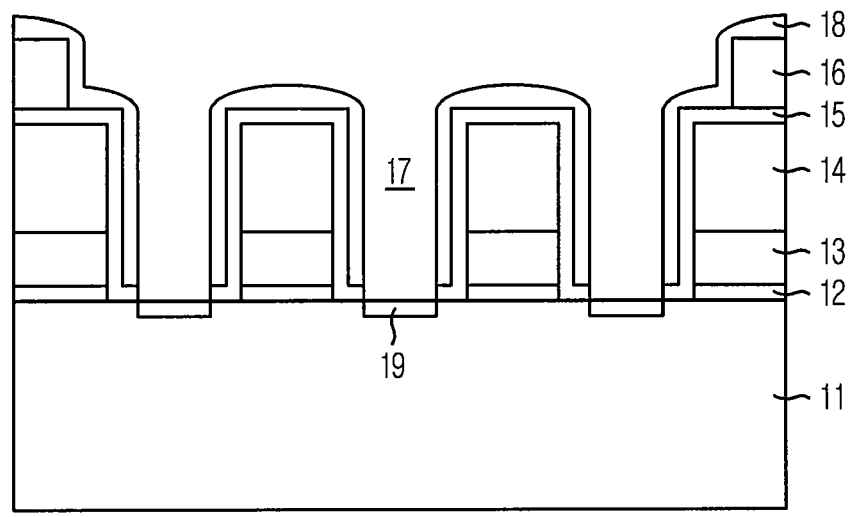
FIGS. 1A and 1B are cross-sectional views showing a typical method for forming a contact in a semiconductor device.
Figure 1B:
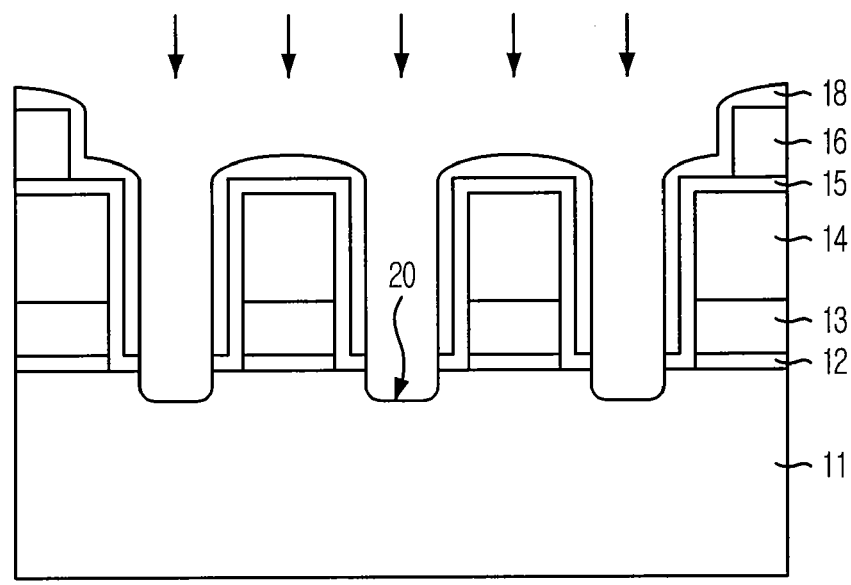
Figure 2A:
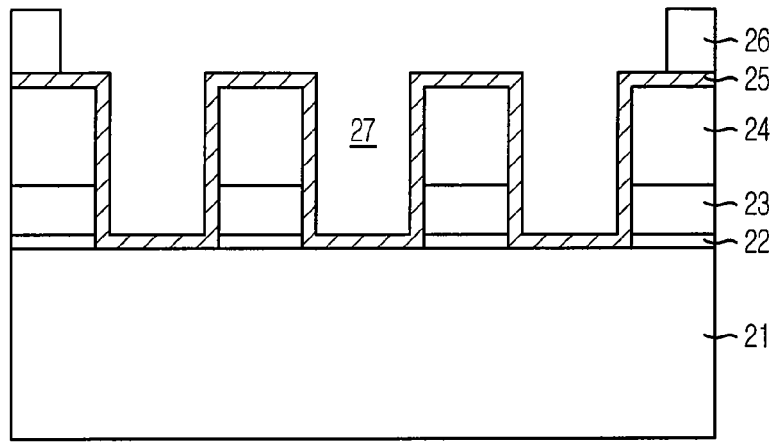
FIGS. 2A to 2E are cross-sectional views showing a method for forming a contact in a semiconductor device in accordance with an embodiment of the present invention.

Referring to FIG. 2A, a plurality of gate patterns are formed over a substrate 21. Each gate pattern includes a gate insulation layer 22, a gate electrode 23, and a gate hard mask layer 24. The gate electrodes 23 may include polysilicon, and the gate hard mask layer 24 may include a nitride-based material. A cell spacer layer 25 is formed over the substrate 21 and the gate patterns. The cell spacer layer 25 functions as an etch barrier during a subsequent landing plug contact etching process. If a subsequent inter-layer insulation layer includes an oxide-based layer, the cell spacer layer 25 includes a nitride-based layer. Accordingly, the cell spacer layer 25 is referred to as a barrier nitride layer.

An insulation layer is formed over the resultant substrate structure to sufficiently gap-fill between the gate patterns. The insulation layer may include borophosphosilicate glass (BPSG). An etching process for forming the landing plug contacts is performed on the insulation layer to form inter-layer insulation layers 26. That is, the insulation layer is etched until the etching stops at the cell spacer layer 25. Accordingly, contact holes 27 are formed after the insulation layer is etched, and the cell spacer layer 25 is exposed at the bottom of the contact holes 27. Generally, landing plugs are formed between gate patterns in a cell region. Thus, the contact holes 27 expose the gate patterns and spaces between the gate patterns.

Figure 2B:
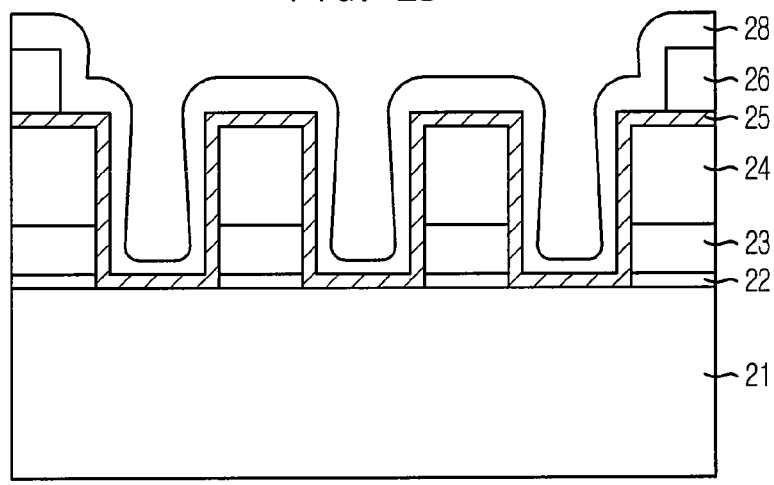

Referring to FIG. 2B, a buffer layer 28 is formed over the resultant substrate structure. The buffer layer 28 includes an oxide-based layer, and thus, is referred to as the buffer oxide layer 28 hereinafter. The buffer oxide layer 28 may include an undoped silicate glass (USG) layer to deteriorate the step coverage. That is, the buffer oxide layer 28 is formed to have a small thickness on the surface of the substrate 21 and sidewalls of the gate patterns and have a large thickness on top of the gate patterns, creating an overhang structure. Such an overhang structure may be obtained using a plasma enhanced chemical vapor deposition (PECVD) method. Forming the buffer oxide layer 28 may compensate etch loss of the gate hard mask layers 24 during a subsequent etch-back process of the buffer oxide layer 28.

Figure 2C:
Figure 2C:
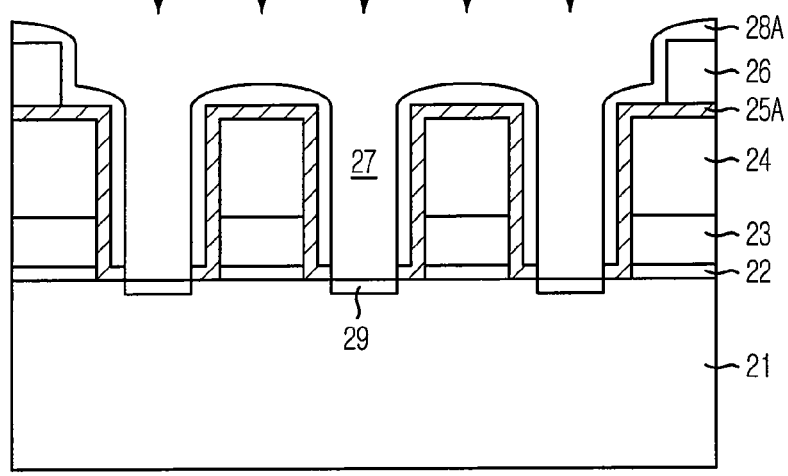

Referring to FIG. 2C, an etch-back process is performed on the buffer oxide layer 28 to open the contact holes 27 exposing surfaces of the substrate 21 between the gate patterns. A recipe is controlled during the etch-back process to remove portions of the cell spacer layer 25 formed over the surfaces of the substrate 21. Reference numerals 28A and 25A refer to patterned buffer oxide layers and cell spacers, respectively. For instance, the buffer oxide layer 28 and the cell spacer layer 25 may be etched at a ratio of approximately 1:1 by controlling the etch selectivity between oxide and nitride to be approximately 1:1. During the etch-back process, substrate damage 29 may be generated by plasma ions because the etch-back process performed on the buffer oxide layer 28 includes performing a dry etch process using plasma.

A post treatment is performed to remove the substrate damage 29 generated during the etch-back process of the buffer oxide layer 28. The post treatment includes performing an etching process referred to as a light etch treatment (LET). For instance, the LET process applies a process using a chemical dry etching (CDE) apparatus. The LET process increases the surface area. In more detail, the post treatment for removing the substrate damage 29 includes a two-step LET process configured with a first post treatment and a second post treatment in accordance with an embodiment of the present invention.

Figure 2D:
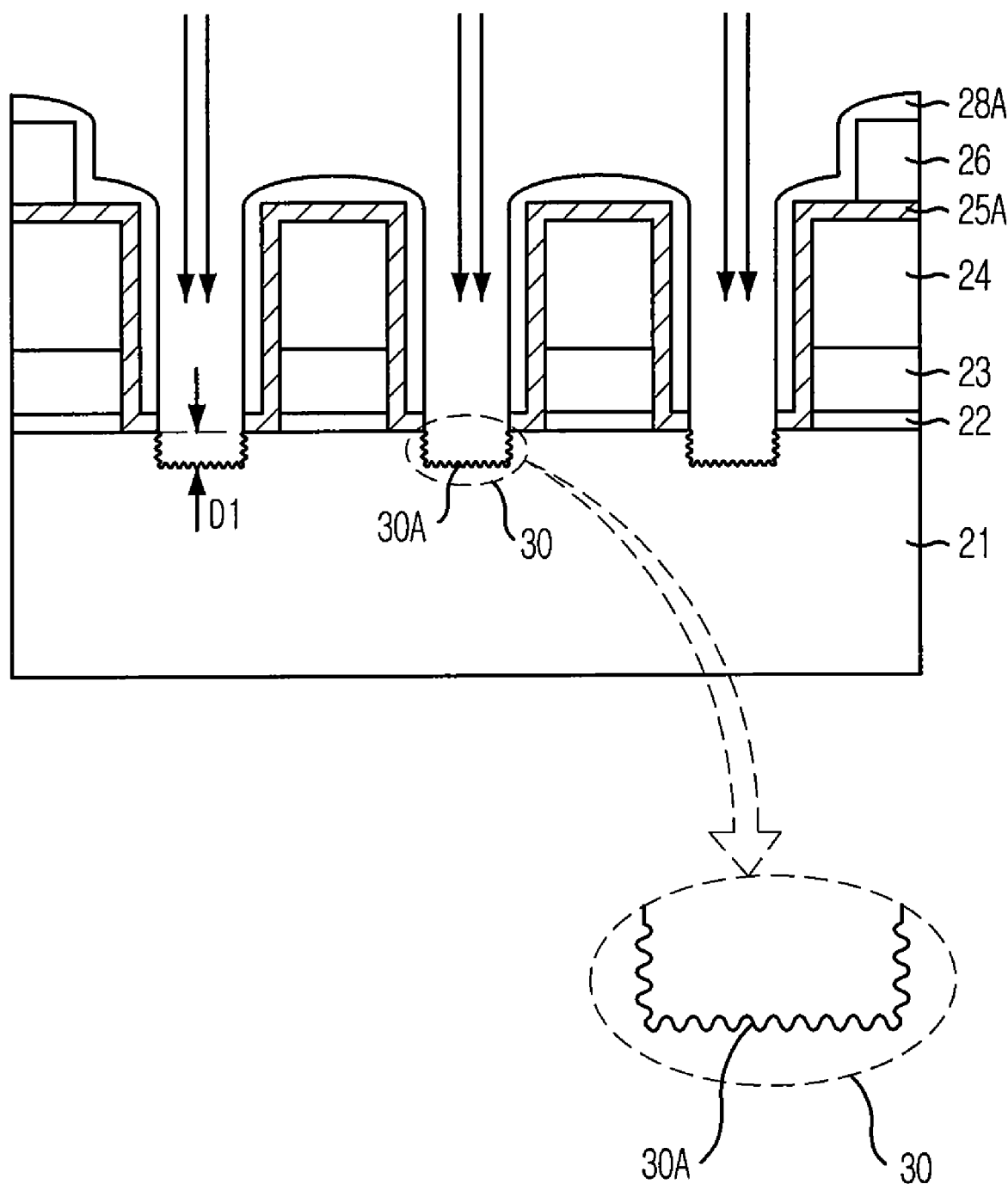

Referring to FIG. 2D, the first post treatment uses fluorocarbon gas as a main gas to remove the substrate damage 29 and generate a substrate depression 30. Rough portions 30A are formed on surfaces of the substrate depression 30. For instance, a flow ratio of tetrafluoromethane ($CF_4$) gas to fluoroform ($CHF_3$) gas may be adjusted in the fluorocarbon gas to change C—C—F series to C—H—F series, increasing the generation rate of polymers. Thus, substrate roughness may be induced.

The first post treatment may use $CF_4$ at a flow rate of approximately 10 sccm to 20 sccm, helium (He) at a flow rate of approximately 500 sccm to 1,000 sccm, and oxygen ($O_2$) at a flow rate of approximately 20 sccm to 40 sccm. The first post treatment may also use $CHF_3$ at a flow rate of approximately 10 sccm to 20 sccm, He at a flow rate of approximately 500 sccm to 1,000 sccm, and $O_2$ at a flow rate of approximately 20 sccm to 40 sccm. As shown in the above recipes, a flow rate ratio of the fluorocarbon gas to the oxygen gas is approximately 1:2. The flow rate ratio of the fluorocarbon gas to the oxygen gas is controlled to be approximately 1:3 or less. By controlling the flow rate ratio, the substrate roughness of the rough portions 30A may be largely induced. Also, it is easy to control the depth D1 of the substrate depression 30 since the oxygen gas does not have a large flow rate. The rough portions 30A largely increase the substrate roughness on the surface of the substrate depression 30. However, the use of fluorocarbon gas may generate carbon contamination.

Figure 2E:
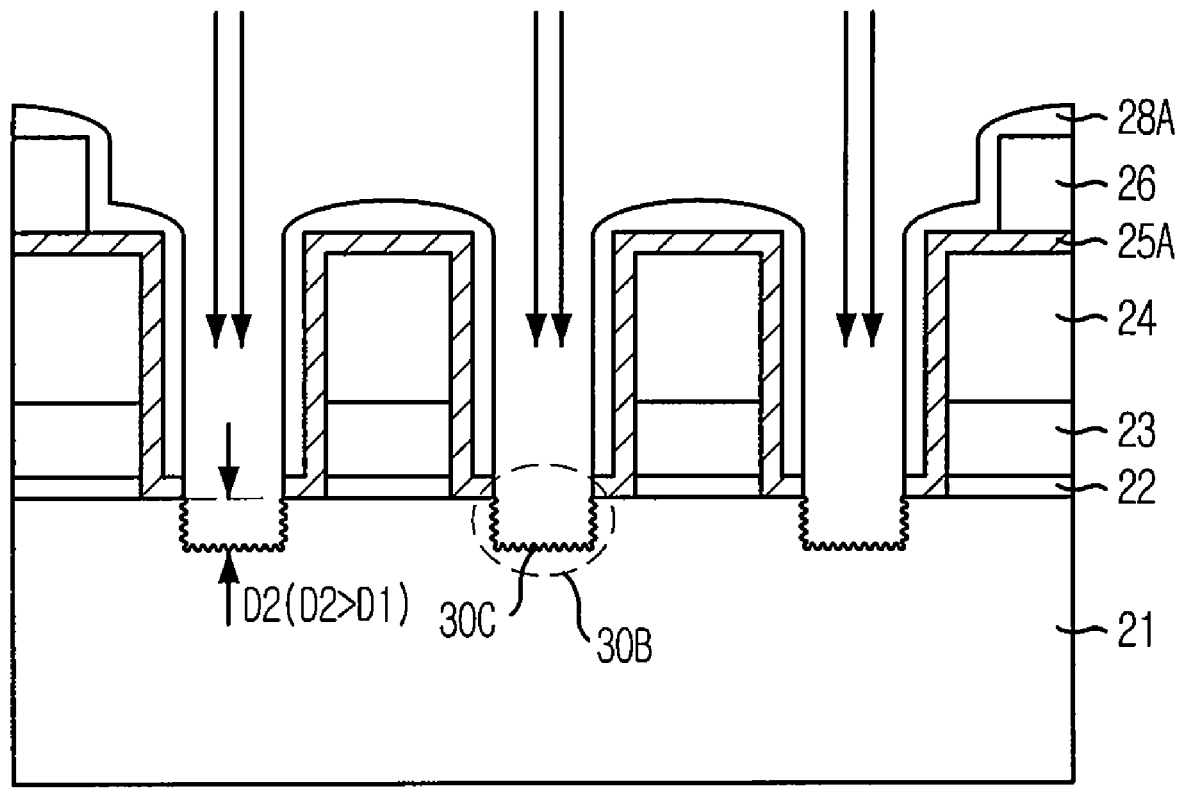

Referring to FIG. 2E, a second post treatment is performed using nitrogen trifluoride ($NF_3$) gas as a main gas. That is, a mixed gas including $NF_3$, He, and $O_2$ is used for etching, each flowing at a rate of approximately 10 sccm to 20 sccm, approximately 500 sccm to 1,000 sccm, and approximately 50 sccm to 100 sccm, respectively. Performing the second post treatment using the $NF_3$ gas as the main gas allows the removal of carbon contamination. Furthermore, the depth D1 of the substrate depression 30 is increased to a depth D2 while still maintaining remaining rough portions 30C at deepened substrate depression 30B.

Referring to the post treatment process, the first post treatment and the second post treatment both use a high pressure ranging from approximately 1,000 mTorr to 1,500 mTorr and a high source power of approximately 2,500 W or greater (i.e., ranging from approximately 2,500 W to 5,000 W). Thus, a mean free path and a residence time of the etchant is increased to further increase the surface area. The ratio of a targeted etch loss in the substrate in the first post treatment to the second treatment is approximately 2:1. The substrate depression generated in the first post treatment is controlled to approximately two times the substrate depression generated in the second post treatment. Thus, surface roughness is increased.

Figure 3A:
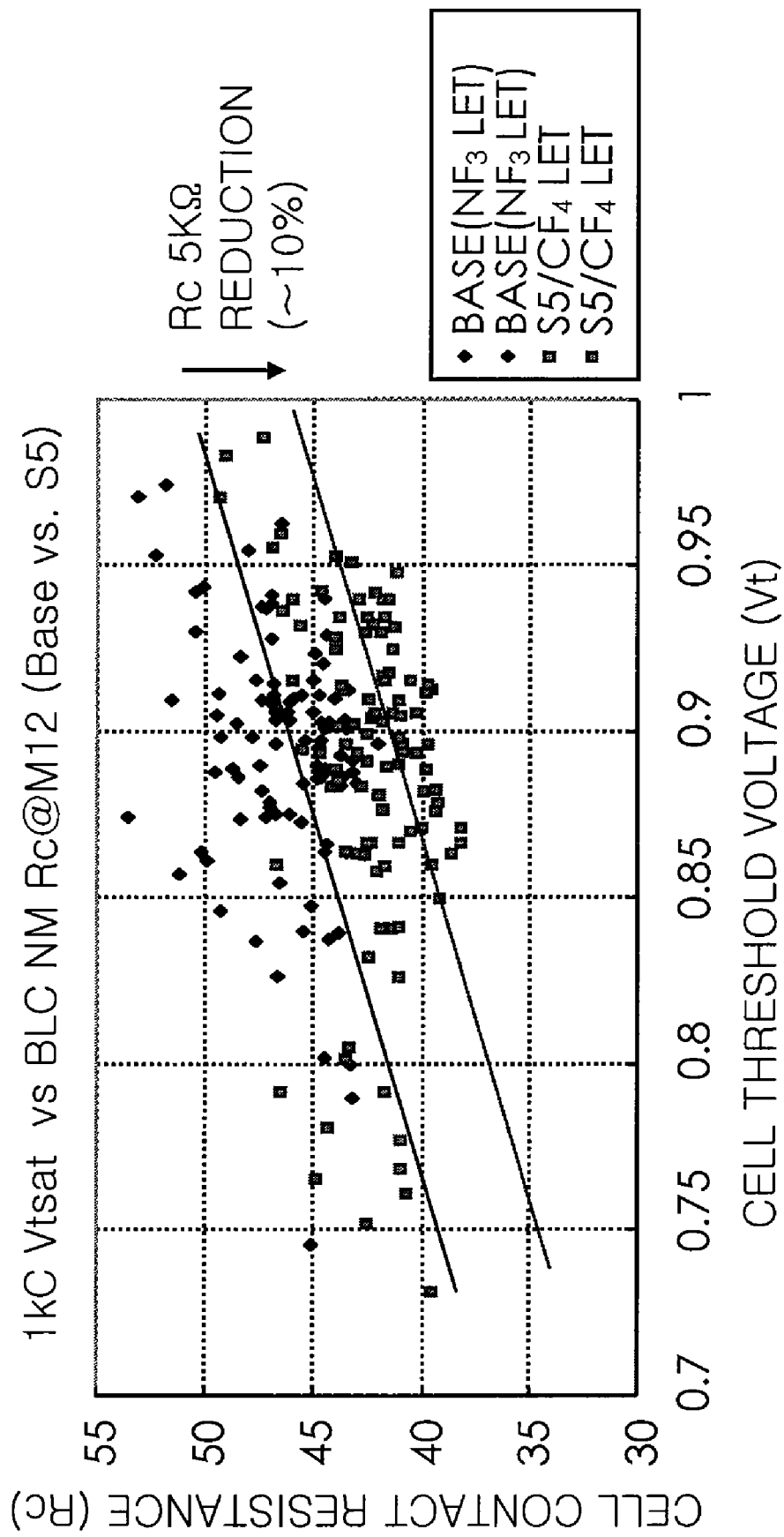
FIGS. 3A and 3B illustrate graphs comparing contact resistances in accordance with an embodiment of the present invention.
Figure 3B:
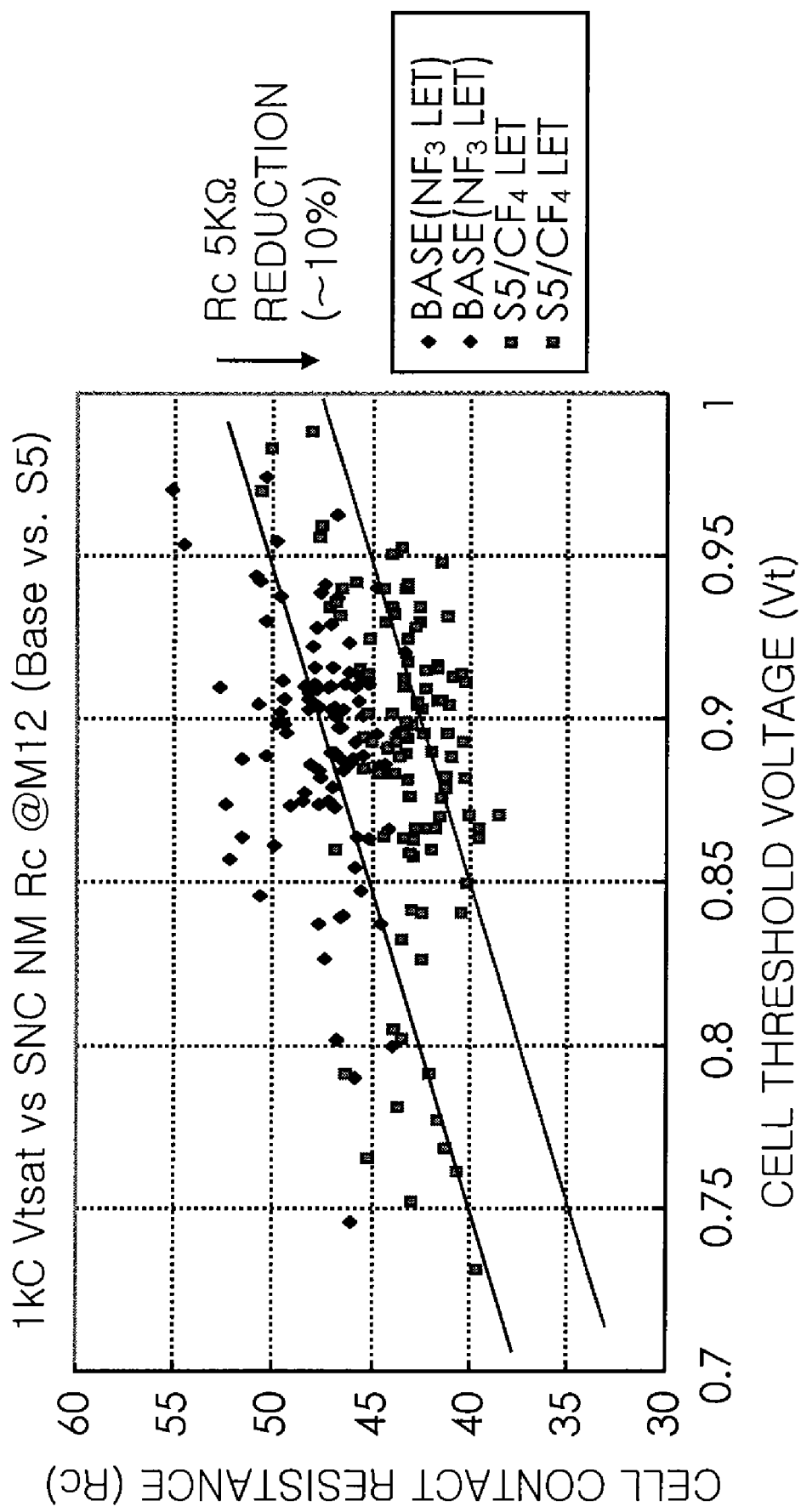

FIGS. 3A and 3B illustrate graphs comparing contact resistances in accordance with an embodiment of the present invention. FIG. 3A shows a contact resistance of a bit line contact (BLC), and FIG. 3B shows a contact resistance of a storage node contact (SNC). Reference denotation 'Base [$NF_3$ LET]' refers to the contact resistance of a LET process using $NF_3$ gas, and reference denotation 'S5/$CF_4$ LET' refers to the contact resistance of a LET process using $CF_4$ gas. Data of the contact resistance according to the 'S5/$CF_4$ LET' are denoted with '■'. Referring to FIGS. 3A and 3B, the contact resistance of the LET process using the $CF_4$ gas is decreased by approximately 10% when compared to the LET process using the $NF_3$ gas.

Figure 4A:
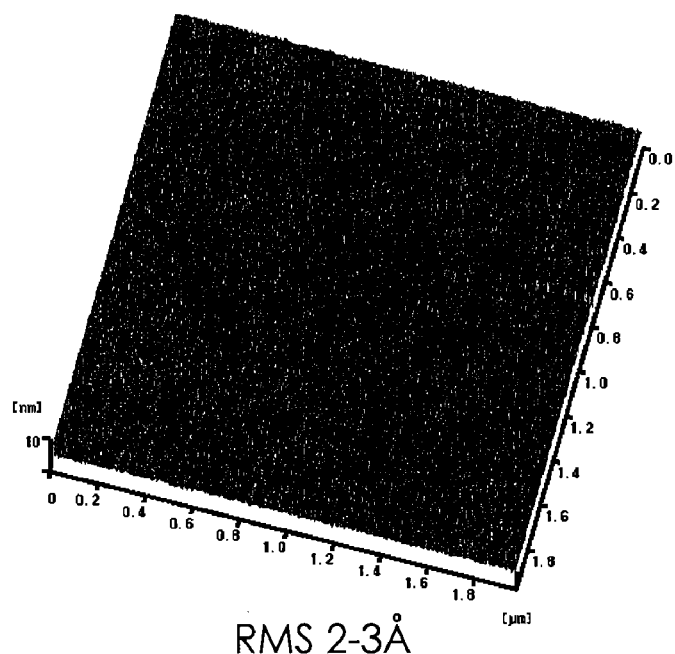
FIG. 4A illustrates an image of surface roughness according to a typical method.
Figure 4B:
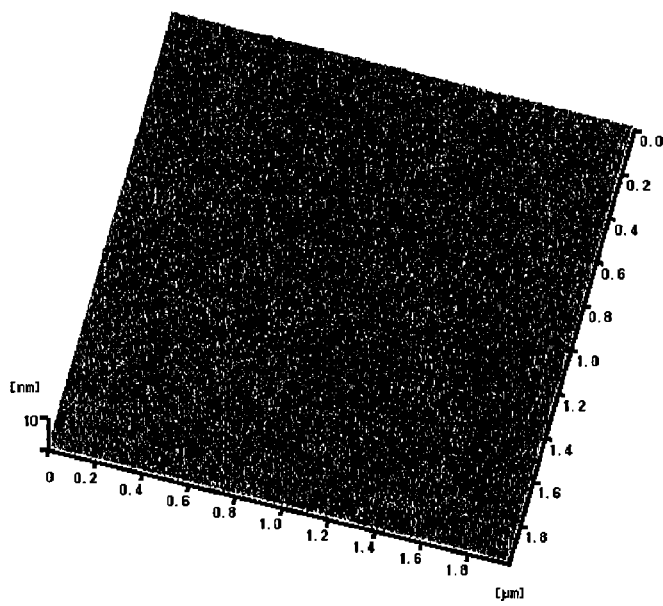
FIG. 4B illustrates an image of surface roughness according to an embodiment of the present invention.

FIG. 4A illustrates an image of surface roughness according to typical method, and FIG. 4B illustrates an image of surface roughness according to an embodiment of the present invention. The surface roughness results are given in root mean square (RMS) using an atomic force microscope (AFM). Referring to FIGS. 4A and 4B, the surface roughness resulting from a LET process using fluorocarbon gas according to this embodiment is substantially larger when compared to the surface roughness from a typical LET process using $NF_3$ gas (RMS ranging from approximately 2 Å to 3 Å). The surface roughness according to this embodiment increases by approximately 90% or more when compared to the typical method as shown in FIG. 5.

Figure 5:
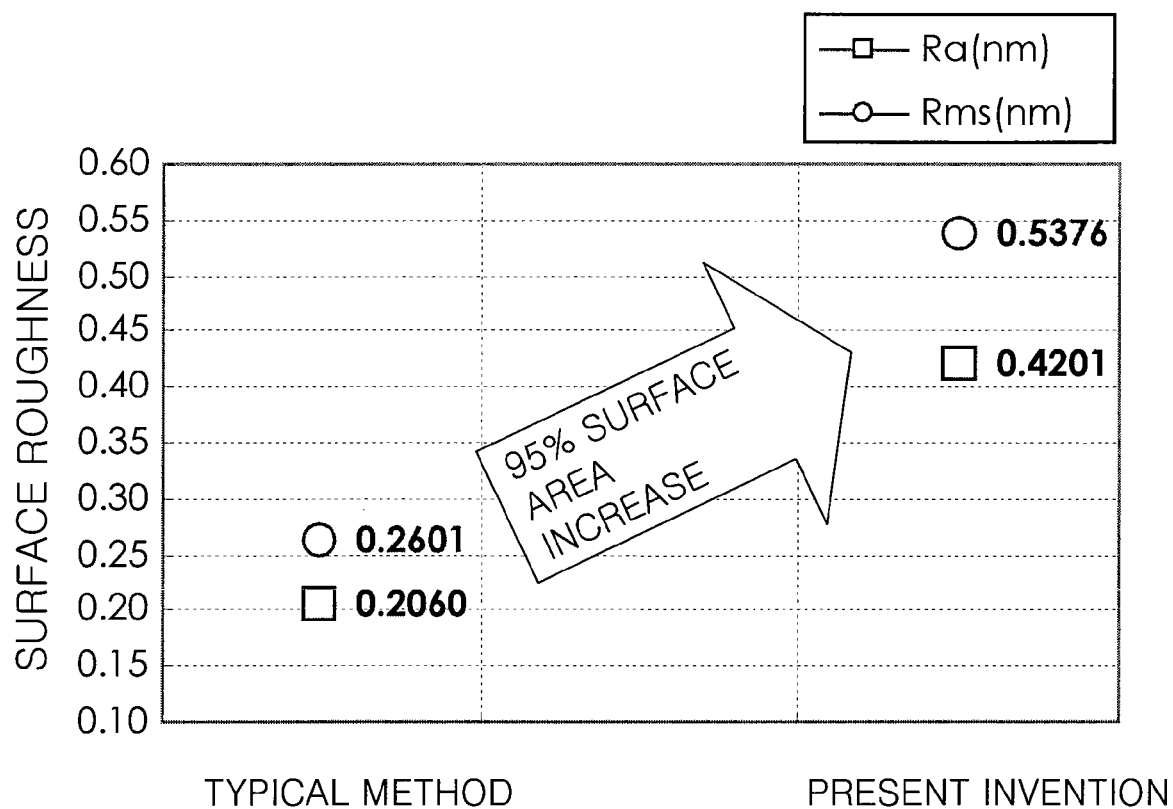
FIG. 5 illustrates a graph comparing surface roughness values of a typical method and an embodiment of the present invention.

FIG. 5 illustrates a graph comparing surface roughness values of a typical method and an embodiment of the present invention. 'Ra' represents average surface roughness values. The surface area increases by approximately 95% due to increased surface roughness in this embodiment using the first and second post treatments when compared to the typical method.

According to the embodiments of the present invention, applying the two-step LET process including the first post treatment and the second post treatment may allow maintaining the demanded substrate depression depth and reducing leakage current. At the same time, the contact resistance values may be improved by increasing the contact area by more than approximately 10% through increasing the surface roughness.

While the present invention has been described with respect to specific embodiments, it will be apparent to those skilled in the art that various changes and modifications may be made without departing from the spirit and scope of the invention as defined in the following claims.

What is claimed is:

1. A method for forming a contact in a semiconductor device, the method comprising:
   opening a contact hole exposing a surface of a substrate, wherein the contact hole is opened by using a plasma;
   performing a first post treatment to form a first depression with a rough portion at a bottom surface of the contact hole; and
   performing a second post treatment to form a second depression beneath the first depression, wherein the second depression has an increased surface roughness relative to the rough portion generated in the first post treatment,
   wherein the ratio of a targeted etch loss in the substrate in the first post treatment to the second post treatment is approximately 2:1.

2. The method of claim 1, wherein performing the first post treatment comprises using a fluorocarbon gas and performing the second post treatment comprises using a nitrogen trifluoride ($NF_3$) gas.

3. The method of claim 2, wherein performing the first post treatment comprises using a gas mixture including the fluorocarbon gas, oxygen ($O_2$) gas, and helium (He) gas, a flow rate ratio of the fluorocarbon gas to the $O_2$ gas being approximately 1:3 or less, wherein the fluorocarbon gas is the main gas.

4. The method of claim 3, wherein the gas mixture comprises a recipe including tetrafluoromethane ($CF_4$) gas flowing at a rate of approximately 10 sccm to approximately 20 sccm, the He gas flowing at a rate of approximately 500 sccm to approximately 1,000 sccm, and the $O_2$ gas flowing at a rate of approximately 20 sccm to approximately 40 sccm, or a recipe including fluoroform ($CHF_3$) gas flowing at a rate of approximately 10 sccm to approximately 20 sccm, the He gas flowing at a rate of approximately 500 sccm to approximately 1,000 sccm, and the $O_2$ gas at a rate of approximately 20 sccm to approximately 40 sccm.

5. The method of claim 2, wherein performing the second post treatment comprises using a gas mixture including the $NF_3$ gas, $O_2$ gas, and He gas, wherein the $NF_3$ gas is the main gas.

6. The method of claim 5, wherein performing the second post treatment comprises using a recipe including the $NF_3$ gas flowing at a rate of approximately 10 sccm to approximately 20 sccm, the He gas flowing at a rate of approximately 500 sccm to approximately 1,000 sccm, and the $O_2$ gas flowing at a rate of approximately 50 sccm to approximately 100 sccm.

7. The method of claim 1, wherein performing the first and second post treatments comprises using a high pressure ranging from approximately 1,000 mTorr to approximately 1,500 mTorr and a source power of approximately 2,500 W or greater.

* * * * *